United States Patent [19]

Correale, Jr. et al.

[11] Patent Number: 5,534,803
[45] Date of Patent: Jul. 9, 1996

[54] PROCESS INSENSITIVE OFF-CHIP DRIVER

[75] Inventors: Anthony Correale, Jr., Raleigh; Gary T. Hendrickson, Chapel Hill, both of N.C.

[73] Assignee: International Business Machines Corporation, Armonk, N.Y.

[21] Appl. No.: 420,947

[22] Filed: Apr. 12, 1995

[51] Int. Cl.⁶ .................................................. H03B 1/00
[52] U.S. Cl. .............................. 327/108; 327/2; 327/12; 326/87
[58] Field of Search .............................. 326/52, 54, 55, 326/85, 87, 91; 327/2,3,12,74,75,108–112, 378, 262, 292, 525; 341/155, 158

[56] References Cited

U.S. PATENT DOCUMENTS

| | | | |
|---|---|---|---|
| 4,052,558 | 10/1977 | Patterson | 326/52 |
| 4,535,459 | 8/1985 | Hogge, Jr. | 327/12 |
| 4,689,577 | 8/1987 | Vreeken et al. | 327/12 |
| 4,924,225 | 5/1990 | Dingwall et al. | 341/155 |
| 5,140,326 | 8/1992 | Bacrania et al. | 341/158 |
| 5,220,216 | 6/1993 | Woo | 326/87 |
| 5,297,179 | 3/1994 | Tatsumi | 326/52 |
| 5,307,067 | 4/1994 | Kimura et al. | 341/155 |
| 5,428,309 | 6/1995 | Yamauchi et al. | 327/262 |

*Primary Examiner*—Timothy P. Callahan
*Assistant Examiner*—Jeffrey Zweizig
*Attorney, Agent, or Firm*—Steven B. Phillips

[57] ABSTRACT

A small and efficient control circuit for a compensated CMOS off-chip driver and a driver circuit incorporating the control circuit. The control circuit uses an exclusive OR gate as a phase detector to determine the phase difference between a system clock and a delayed version of the system clock. An RC filter smooths the output of the exclusive OR gate to produce a voltage proportional to the delay introduced in the CMOS circuitry by environmental and process variables. The voltage from the RC filter is used as a control voltage to control the effective channel width of the effective pull-down device of the off-chip driver circuit. An off-chip driver using the control circuit is used in the I/O unit of a CMOS integrated circuit chip.

12 Claims, 7 Drawing Sheets

| a | b | xor |
|---|---|-----|
| 0 | 0 | 0 |
| 0 | 1 | 1 |
| 1 | 1 | 0 |
| 1 | 0 | 1 | ns
PROCESS INSENSITIVE OFF-CHIP DRIVER

BACKGROUND

Field of the Invention

This invention relates to the field of CMOS integrated circuit chips. More particularly, it relates to off-chip driver circuits for such chips. A driver circuit for a CMOS chip provides an signal to an external pin or connection that is used to communicate with other devices in a computer system which uses the CMOS integrated circuit chip.

Description of the Problem Solved

CMOS off chip driver circuits in general are well known. The most common design uses an output stack consisting of a pull-up transistor, a pull-down transistor and an output disposed in between. The circuit is driven by two data inputs where, in active mode, one data input is the complement of the other. FIG. 1 shows such a circuit 100. P17 serves as the pull-up transistor and N2 serves as the pull-down transistor. This circuit is driven by signals DataP and DataN and an output signal is produced at Vout. Devices P18 and P19 serve to self bias the N-wells of all output stage PFET's through terminal Nw1. Since such a driver circuit must often drive devices powered by voltages higher than the 3.3 Volts typically used to power such a circuit, the pull-down transistor is in series with another transistor N1 to form a series stack. This arrangement allows dotting to a higher voltage bus while minimizing breakdown effects. This and other advantages of the series stack are described in the article, "Ground Bounce Control in CMOS Integrated Circuits," T. Gabara et al, *Proceedings of the* 1988 *IEEE Integrated Solid State Circuit Conference*, pp. 88–89, which is incorporated herein by reference. Other examples of circuits using this arrangement are shown in U.S. Pat. No. 4,782,250 to Adams et al. and U.S. patent application Ser. No. 262,207, filed, Jun. 20, 1994, both of which are assigned to the assignee of the present application and both of which are incorporated herein by reference.

While the circuit described above works fine when assembled with transistors of fixed, known, consistent characteristics, problems are introduced when large numbers of such circuits are integrated onto CMOS chips and devices are manufactured in volume. Process variations cause the speed and hence the delay of such driver circuits in propagating signals to vary significantly. Other environmental operating characteristics such as temperature and power supply variations add to this variability, resulting in delay variations in practice of ±50 percent or more. An off-chip driver operating at worst-case operating conditions can exhibit three times the delay of an off-chip driver operating at best-case conditions. Additionally, the di/dt of the circuit varies depending on the delay. A faster circuit exhibits greater di/dt and will therefore cause more system power supply noise. The di/dt of driver circuits and hence the noise they generate is a dominant factor in determining how many off-chip drivers on a given CMOS integrated circuit can switch simultaneously. Noise levels, delay, and delay variation are all factors that must be considered when a circuit is designed and various design trade-offs have to be made.

Designing CMOS integrated circuits is considerably easier if off-chip driver circuits which compensate for delay variation are used. FIG. 2 shows a compensated off-chip driver 200 which includes a feature to compensate for delay variability caused by process variation and other factors. In the circuit 200 of FIG. 2, a number of parallel pull-down fingers, 201, 202, 203 and 204, have been added to the NFET pull-down transistor series stack. In this example four have been added, however any number from one up can be used. The upper NFETs, N3, N5, N7 and N9 are connected to control inputs Z1, Z2, Z3 and Z4. Each control input can turn a finger on or off, thereby allowing the number of fingers in parallel and thus the effective channel width of the pull-down device to be varied. This arrangement provides a handy way to change the operating characteristics of the circuit to account for the characteristics of an individual circuit or group of circuits. For example, in a worst case process variation in which operation is slow and delay is long, all four control inputs are set high and the effective channel width of the pull-down device is at its largest. In a best case process variation with minimum delay, all the control signals are set low, and only the base single pull-down finger is in the circuit, minimizing effective channel width. A circuit with essentially this arrangement is described in the paper, "VLSI Performance Compensation for Off Chip Drivers and Clock Generation," D. Cox et al., *Proceedings of the* 1989 *IEEE Custom Integrated Circuit Conference*, pp. 14.3.1–14.3.4 which is incorporated herein by reference.

A significant problem with the above compensated off-chip driver topology is designing a control circuit to turn control inputs on and off depending on the particular driver's operating characteristics. Such a control circuit needs to turn the right number of control inputs on based on process or environmental variables. Ideally, the control circuit should automatically sense the variables and adjust the control inputs accordingly. Such a control circuit is described in the above referenced article; however, that circuit is complex and requires components external to the driver circuit that would in most cases also have to be placed external to the CMOS chip. For example, the circuit uses a crystal to set the frequency of the oscillator (see FIG. 1 of the article.) Another possibility is to bring the control inputs to pins on the CMOS chip incorporating the off-chip driver. This arrangement allows a user designing a system using the chip to determine which inputs need to be set high in order to achieve the operating characteristics desired for a given lot of chips. The disadvantages of this scheme are significant. External components are required and an extra design burden is put on purchasers and users of the CMOS chip.

What is needed is a simple, small control circuit for a compensated CMOS off-chip driver that requires no components external to a CMOS chip on which the driver is used. Such a circuit should take up as little space as possible on the chip, and must automatically sense changes in operating characteristics caused by process variations and environmental factors.

SUMMARY

The present invention provides a small efficient control circuit for a compensated CMOS off-chip driver. The control circuit has a clock terminal through which it receives the system clock signal. It also has one or more control terminals which interface with the control terminals of the pull-down fingers of the off-chip driver circuit. The circuit has a phase detector, which in the preferred embodiment is an exclusive OR gate. The exclusive OR gate receives as input the system clock, and a delayed version of the system clock signal. The delay is achieved by passing the signal through a delay circuit disposed between one terminal of the phase detector and the system clock terminal. The output of the phase detector is connected to an integrator, which in the preferred embodiment, is an RC filter. Disposed between the RC filter and the control terminals is a comparator bank. In the preferred embodiment, this is a bank of one or more comparators, each comparator connected so that it compares the voltage at the output of the filter to a different reference voltage. The combination of the phase detector and the filter cause the voltage at the output of the filter to be proportional to the delay introduced by the delay circuit. In this way, the number of control inputs which are high or turned on is proportional to the voltage at the output of the filter.

The circuit described above optionally includes a latch which can be a multi-bit latch or a register where the number of bits is equal to the number of control inputs and/or comparators. This latch causes the circuit to set the appropriate effective pull-down channel width for the driver circuit when the system is powered-up and maintain that effective channel width regardless of further variations. The circuit also optionally includes a delay selector to adjust the delay of the delay circuit for different clock speeds. The reasons for such adjustment will be explained later.

The control circuit according to this invention is connected to a compensated CMOS off-chip driver circuit, and integrated onto the same CMOS integrated circuit chip as the driver circuit. Since the delay circuit of the control circuit is constructed on the same CMOS chip, it's delay will be subject to the same process and environmental variables as the off-chip driver circuit, thus providing an automatic adjustment. The off-chip driver circuit comprises first and second supply voltage terminals, first and second data input terminals, an output terminal, and a pull-up transistor disposed between the first supply voltage terminal and the output terminal. The first and second supply voltage terminals are normally connected to the supply voltage VDD and ground. The circuit includes a pull-down means responsive to the voltage at the second data input terminal, and which is connected to the control circuit of the present invention. The driver circuit also includes a self-biasing mechanism for the N-wells of the PFET transistors. The off-chip driver circuit and control circuit are ideally used in an I/O unit on a CMOS integrated circuit having logic for performing calculations.

This invention provides a process compensated CMOS off-chip driver with a process-sensitive control circuit that is small, simple and has relatively few components. The control circuit requires no crystals or other components external to the driver circuit and can therefore be easily integrated onto the CMOS chip where the off-chip driver circuit is being used. The control circuit can also be made and used with circuit technologies other than CMOS. The control circuit requires only the system clock as an input and automatically senses process and environmental variations. An optional latch feature can be employed with the circuit, primarily to conserve power, and a variable delay feature can be used to allow the circuit to be used at various different system clock speeds.

DETAILED DESCRIPTION OF THE PREFERRED EMBODIMENTS

Figure 3:
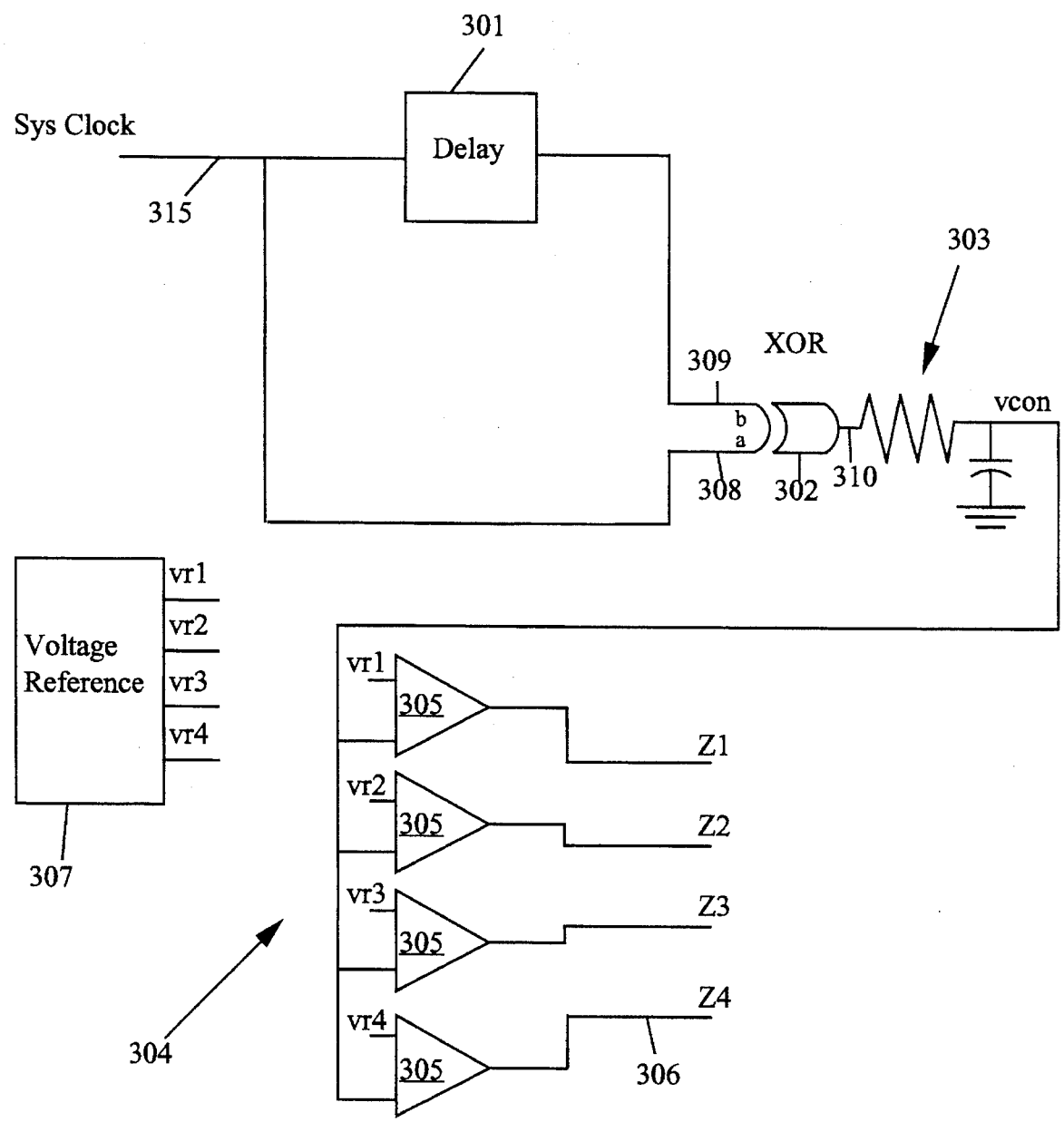
FIG. 3 shows a schematic diagram of the preferred embodiment of the control circuit of the present invention, without the optional latch and delay selection features.

A preferred embodiment of the control circuit of this invention is shown in FIG. 3. The control circuit receives the system clock signal as input at 315. The exclusive OR (XOR) gate 302 is used as a phase detector. While we have chosen to use an XOR gate as a phase detector, a combination of logic elements or gates can be used to realize various phase detectors. The XOR gate receives the system clock as input at 308. At input 309, the XOR gate receives a delayed version of the system clock. Delay circuit 301 is used to create the delayed version of the system clock. Delay circuit 301 must be designed so that the amount of delay introduced is the same or is proportional to the delay introduced in the off-chip driver circuit by process and environmental variables. Any of various well known designs for a delay circuit can be used. In the preferred embodiment a string of non-inverting buffers is used. An even number of inverting buffers can also be used. Since the system clock serves as a frequency reference for both the delayed and non-delayed inputs of the XOR, the tight control of the duty cycle normally needed for phase locked loop implementation is not required. In fact, this approach affords the use of low cost oscillators with duty cycles in the range of 35/65 percent rather than the costly 50/50 percent oscillators.

Figures 8, 9:
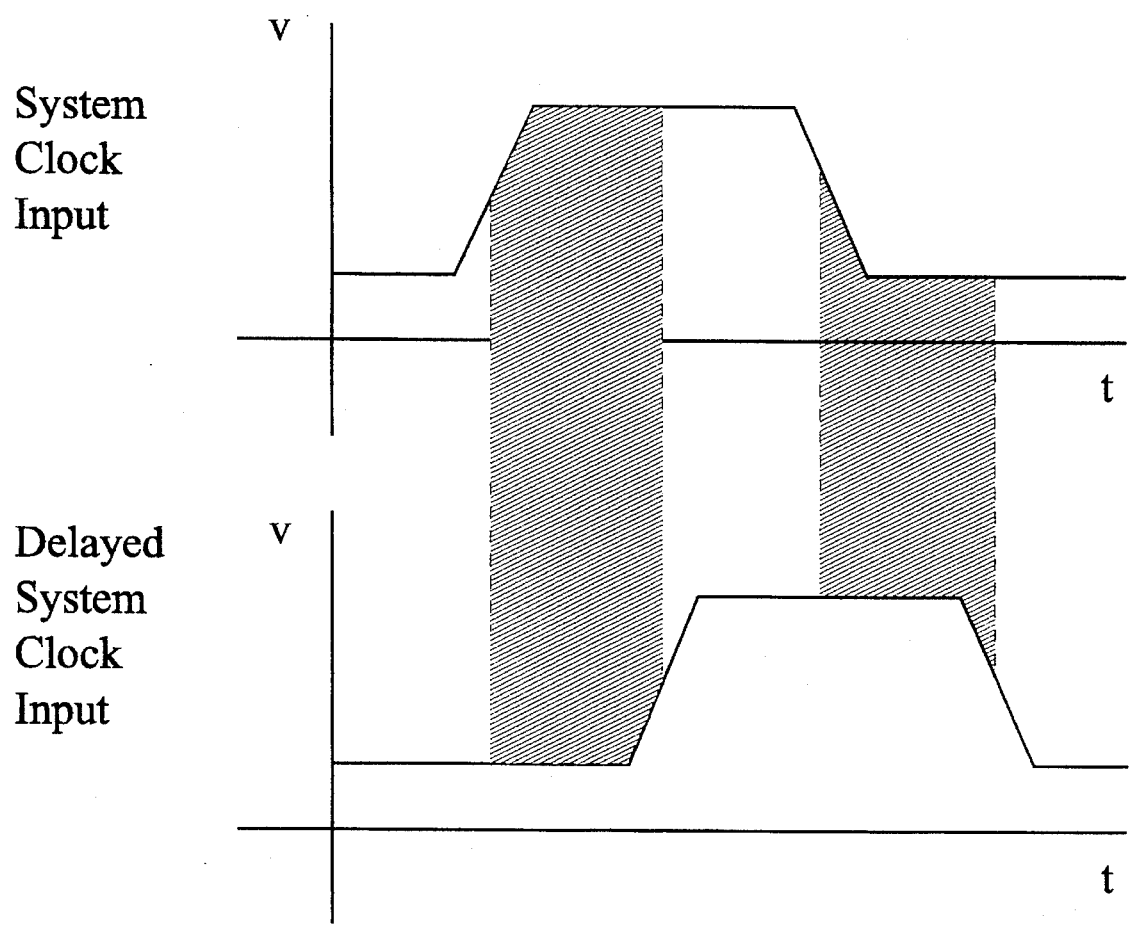
FIG. 8 shows an output table for the XOR gate used in the circuit of the present invention.
FIG. 9 is an illustration showing the relationship of the output of the exclusive OR gate in the control circuit of the present invention to the delay introduced by the delay circuit.

FIG. 8 illustrates how the XOR gate works to provide a phase comparison which indicates the delay between the system clock and the delayed version of the system clock. The truth table in FIG. 8 shows that when the XOR inputs a and b are the same voltage level or logical state, the output 310 of the XOR gate is logical 0 or low. When the inputs a and b are different voltage levels, as when one is high representing a logical 1, and the other is low representing logical 0, the output 310 of the XOR gate is logical 1 or high. The terms "low" and "high" refer to the relative voltage level. If the two inputs are synchronized, that is there is no delay at all, the output of the XOR gate will always be logical 0 or low. As the delayed version of the system clock lags behind the system clock itself there will be periods of time, shown as the cross-hatched areas in the voltage graph of FIG. 8, in which the voltages at the inputs to the XOR gate will be different and the output of the XOR gate will be high. The more the delayed version of the system clock lags the system clock itself, the longer these periods will be. If the delayed version of the system clock lags behind the system clock ½ period, so that the two input waveforms are 180 degrees apart, the voltages at the XOR inputs a and b, 308 and 309, will be different all of the time, and the output of the XOR gate 310 will always be high. Thus, the amount of time the output 310 of the XOR gate 302 is high is directly proportional to the delay of the delay circuit 301, which in turn has the same delay characteristics as the off-chip driver circuit with which the control circuit is used.

Figure 6:
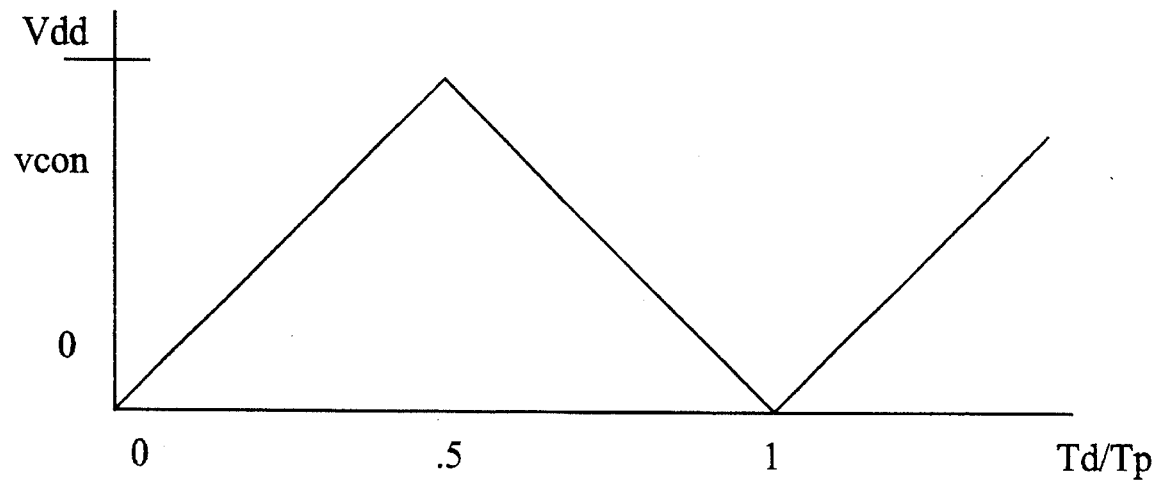
FIG. 6 is a plot of the average DC value of the output voltage of the RC filter in the circuit of the preferred embodiment as a function of phase delay.
Figure 7:
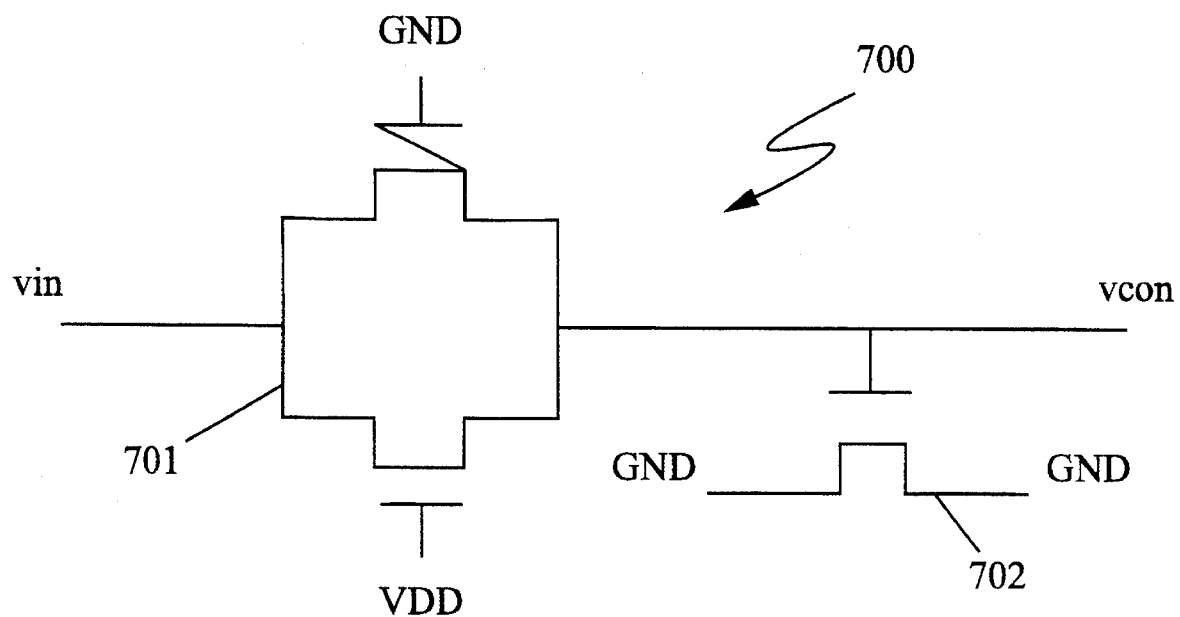
FIG. 7 shows a way of constructing the RC filter of the control circuit of the present invention on a CMOS integrated circuit.

The XOR gate 302 of FIG. 3 is connected to RC filter 303 which serves as an integrator. While we have chosen to use an RC filter as an integrator, other devices, for example a charge pump, can be used. The capacitor in the RC filter stores some of the energy from each period in which the voltage at the output 310 of the XOR gate is high. The filter smooths out the square waveform which is produced at the output 310 of the XOR gate. The RC filter therefore produces a control voltage vcon which is proportional to the delay introduced by the delay circuit. A plot of vcon vs. the delay expressed as a fraction of a period, Td/Tp is shown in FIG. 6. As indicated above, when the delay is equal to half a period, or 0.5, the voltage vcon is at its maximum, which is Vdd, the supply voltage for the driver circuit. RC filters are well known and easily understood by those skilled in the circuit arts. FIG. 7 illustrates a simple way of constructing an RC filter 700 out of CMOS components that can be integrated onto a microchip. The parallel transistors 701 form a resistor and the transistor 702 acts as a capacitor.

Figure 1:
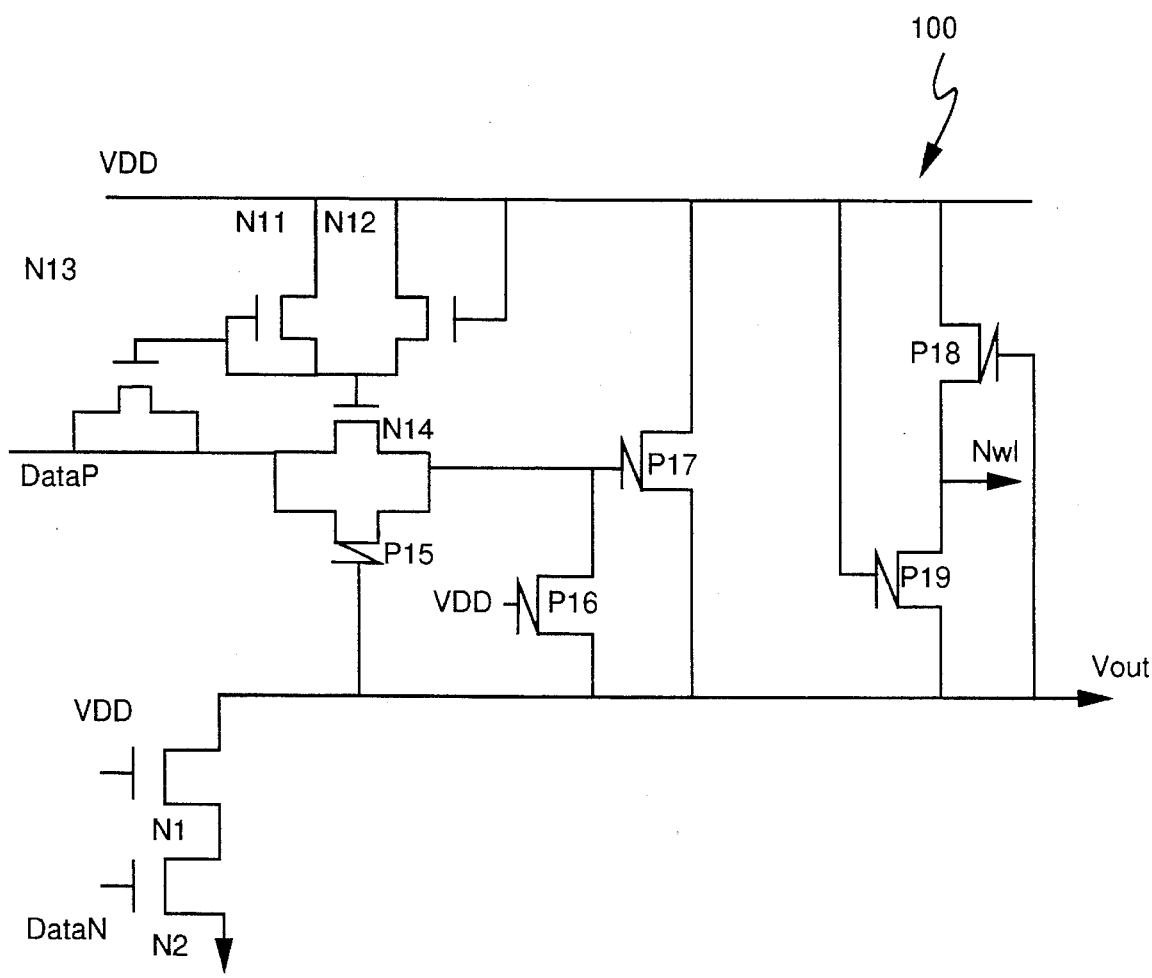
FIG. 1 shows a schematic diagram of a CMOS off-chip driver circuit having a self-biasing N-well feature.
Figure 2:
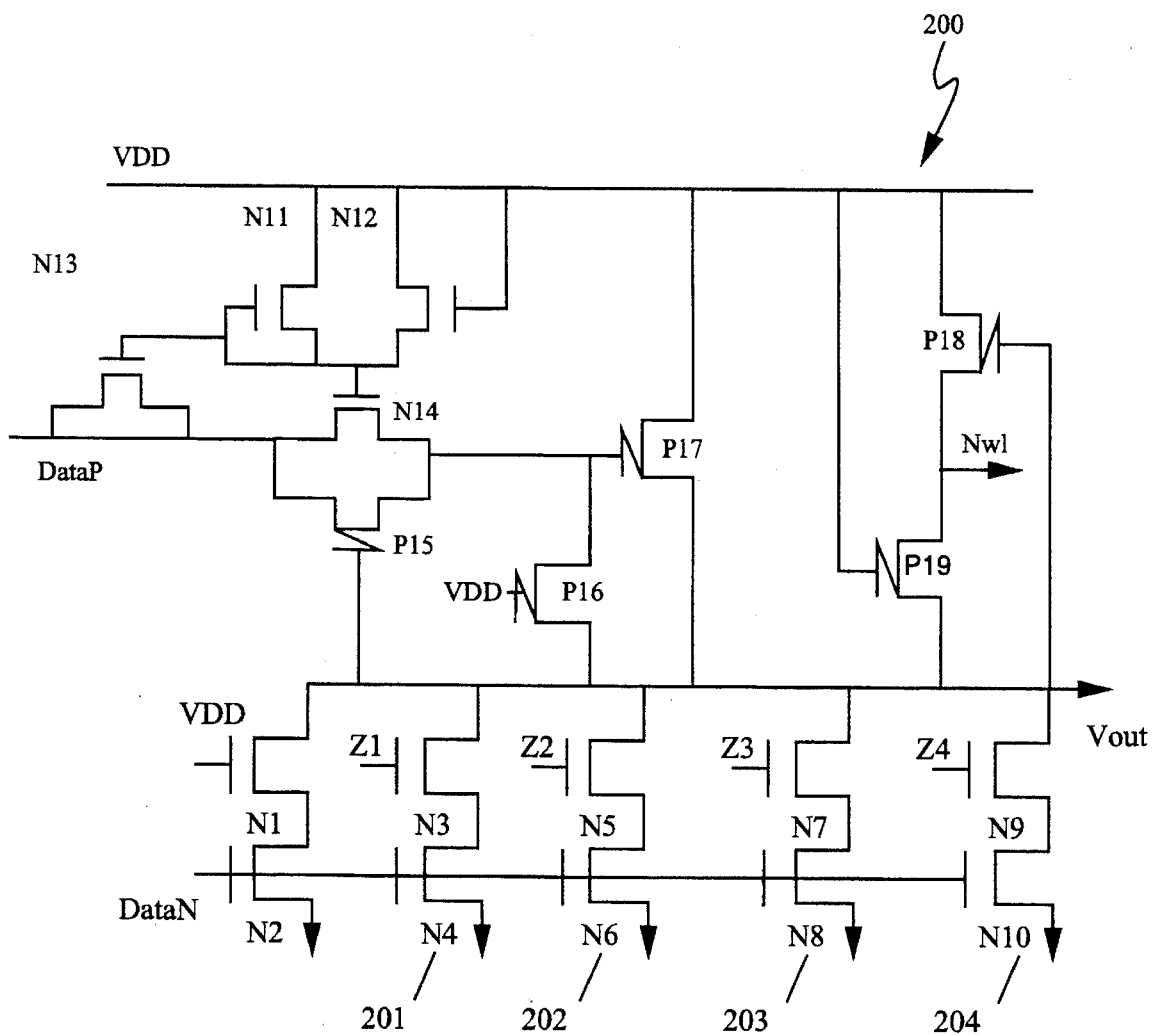
FIG. 2 shows a schematic diagram of a process compensated CMOS off-chip driver circuit with which the control circuit of the present invention is used also having a self-biasing N-well feature.

Returning to FIG. 3, the control voltage vcon is fed to a comparator bank comprising a number of comparators 305. In the embodiment of FIG. 3, there are four comparators, one for each control input 306 of the pull-down means of the off-chip driver circuit 200 of FIG. 2. In general, there must be one comparator for each control input to the off-chip driver circuit being controlled. This number can vary from one up and is a design choice. Each comparator 305 is normally off and has no voltage at its output. When the voltage vcon which is connected to one input of a comparator becomes higher than the reference voltage at the other input to the same comparator, the comparator turns on and the output voltage of the comparator becomes high. The control input to which the comparator output is connected in turn becomes high and enables the corresponding pull-down finger of the pull-down means in the off-chip driver circuit. The reference voltage for each comparator is provided by a voltage reference 307. In the case of a circuit of FIG. 3 which has four comparators, the reference voltages vr1, vr2, vr3 and vr4 are provided, and are selected so that the number of comparators turned on is proportional to the control voltage vcon. Therefore, the number of pull-down fingers in the off-chip driver circuit which are turned on, and thus the effective channel width of the pull-down device, is proportional to the control voltage vcon. A simple resistor network arranged as a voltage divider with multiple output taps is used in the preferred embodiment of the control circuit. For an off-chip driver circuit powered by 3.3 Volts having four control inputs, we use reference voltages of 1.2, 1.4, 1.7 and 2.0 Volts; however, the voltages chosen are implementation dependent.

Figure 4:
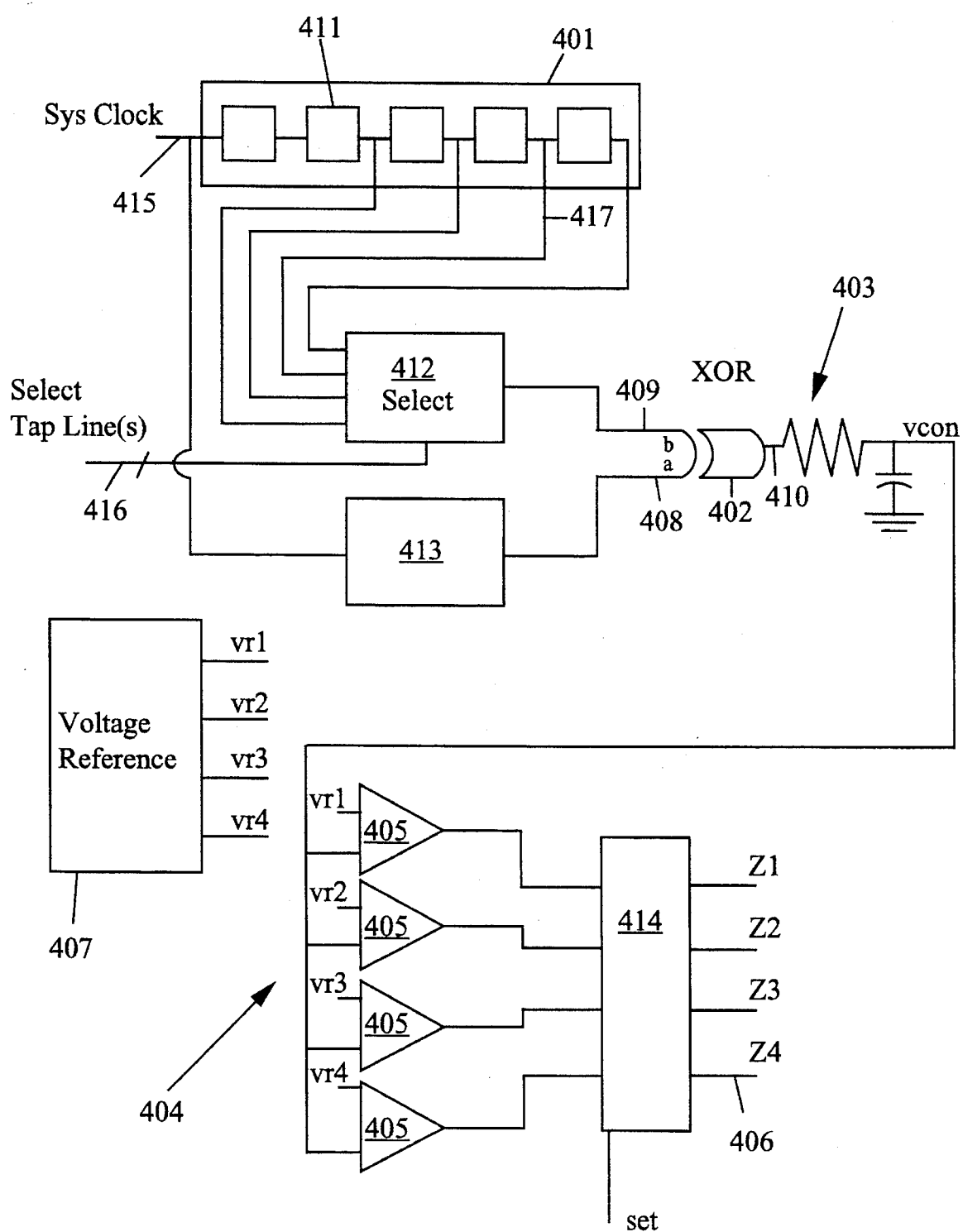
FIG. 4 shows a schematic diagram of the preferred embodiment of the control circuit of the present invention with both the optional latch feature and the optional delay selection feature.

FIG. 4 shows another embodiment of the control circuit of this invention. This embodiment is similar to that of FIG. 3, as evidenced by the correlative reference numerals, except that the embodiment of FIG. 4 has two optional features. First, in place of the delay circuit 301 of FIG. 3, the circuit of FIG. 4 has variable delay circuit 401 and a selector. The delay circuit 401 is a delay chain including multiple delay elements 411 with delay taps 417 connected in between. Where a string of buffers is used as a delay circuit, each buffer is a delay element. The delay taps are connected to a selector 412, which has select tap line(s) 416 that serve as a delay range selection input and allows a designer or user to determine how much delay is introduced in the delayed version of the system clock which is fed into XOR gate input b, 409. In practice the number of select tap lines depends on the number of delay taps, since the number of bits required to control the selector depends on the number of selector inputs. The selector can be controlled directly through pins on an integrated circuit chip, or through additional logic which in turn my be controlled by a program. Delay compensation means 413 is introduced to compensate for any delay introduced by the selector 412. In practice the same circuit is usually used for a delay compensation circuit 413 as is used for the delay circuit 401.

This variable delay feature is important because an integrated circuit which uses the control circuit of this invention might be used in systems of varying system clock speeds. Faster system clock speeds require smaller delays. Returning to FIG. 6, it is apparent that if the delay introduced by the delay circuit is a full period (Td/Tp=1), the output of the XOR gate is 0: the same as if there is no delay at all. The proper operation of the control circuit of FIG. 3 is only assured if the delay is less than ½ period. The variable delay feature of FIG. 4 allows a user to select a different range of delay for each possible system clock speed to ensure that the circuit remains within its operating delay range. For example, where a delay circuit is constructed of ten identical delay elements that are chained together when a system clock is running at 25 MHz, the number of elements needs to be reduced to five for a system clock running at 50 MHz. This change can be accomplished by merely switching the selector to the appropriate tap.

A second optional feature of the control circuit of FIG. 4 is a latch. Latch 414 will capture and maintain the voltage levels at the control inputs 406 at the moment the set line is set high. This feature is useful if it is desirable to set the effective channel width of the pull-down means of the off-chip driver circuit on power-up of the system and keep it set the same way until the system is reset. Keeping the control input voltages locked ensures that the characteristics of the off-chip driver circuit do not change suddenly during a critical operation. It also allows the supply voltage for the rest of the control circuit to be shut off to conserve power. The two optional features shown in FIG. 4, the variable delay feature and the latch, need not be used together. A control circuit according to this invention can be made with either the variable delay feature, or the latch, both or neither.

Figure 5:
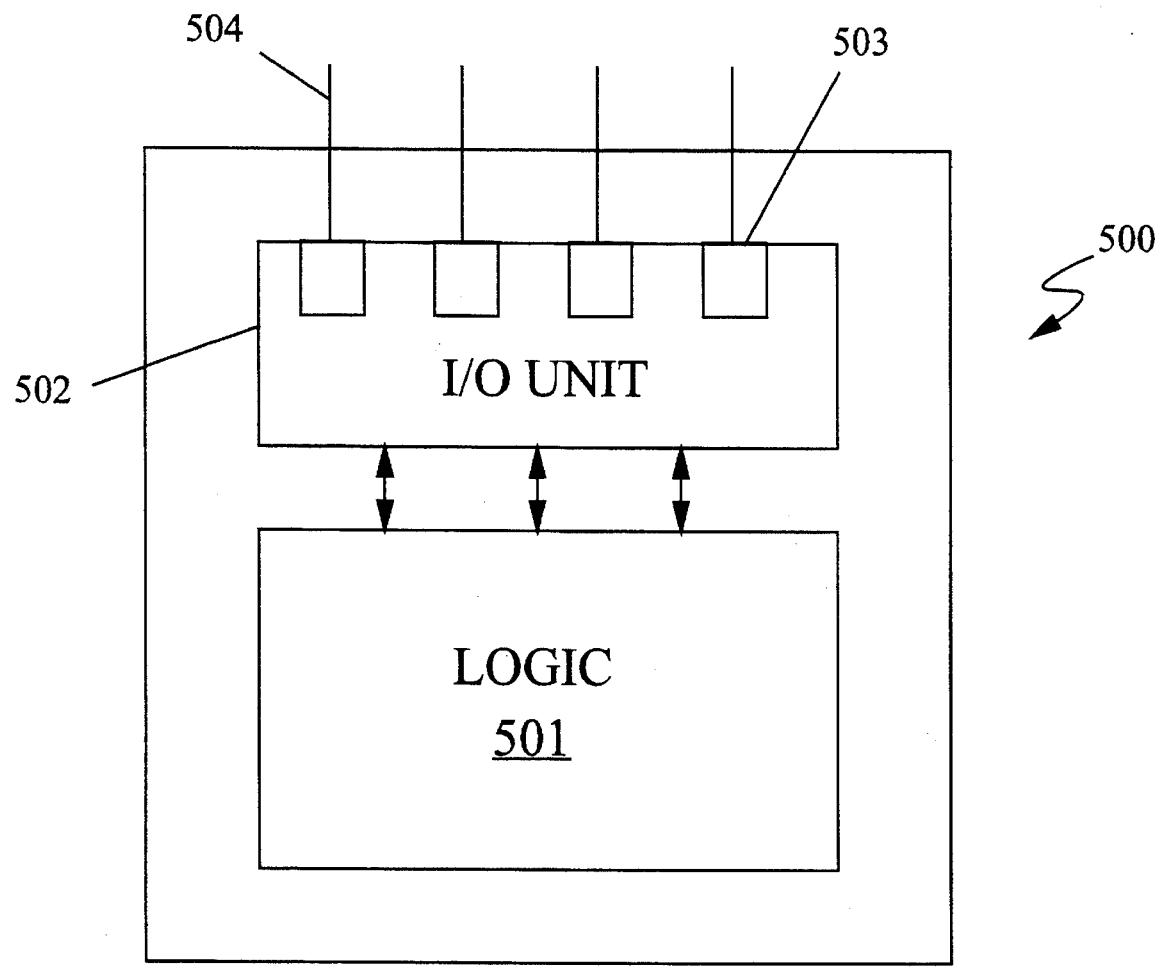
FIG. 5 shows a block diagram of a CMOS integrated circuit chip on which the present invention is used.

FIG. 5 shows a typical operating environment for an off-chip driver circuit which uses the present invention. In FIG. 5, CMOS integrated circuit 500 includes logic 501, connected to an input/output (I/O) unit 502. Data is received through connections 504, transferred to the logic 501 through the I/O unit 502 and calculations are performed using the data. Results are then transferred from the logic 501 to the I/O unit 502. The I/O unit incorporates process insensitive off-chip drivers 503, each controlled by the control circuit of the present invention. The I/O unit 502 sends results to other components in a system through connections 504 using the off-chip driver circuits 503. One control circuit can control all the off-chip driver circuits on a chip, or several control circuits can be used, each controlling one or a group of off-chip driver circuits.

We have described a specific embodiment of our invention and a specific operating environment. The control circuit of the invention, however, has many uses. It can be used with off-chip driver circuits of different and widely varied topologies, and in integrated circuit chips of different types. The control circuit itself can be made using different device types and circuit technologies as long as the logic function remains the same. The control circuit can also be used to control different parts of an off-chip driver circuit, for example, an effective pull-up device instead of an effective pull-down device.

We claim:

1. A control circuit for a compensated driver circuit, the control circuit comprising:

a clock terminal;

one or more control terminals for connection to one or more respective control inputs of said compensated driver circuit;

an exclusive OR gate having first and second inputs and an output, the first input of the exclusive OR gate connected to the clock terminal;

a delay circuit disposed between the clock terminal and the second input of the exclusive OR gate, the delay circuit being formed only by a single chain of delay elements connected in series so that the delay is influenced only by the number of delay elements and process and environmental variables;

an RC filter connected to the output of the exclusive OR gate; and one or more comparators disposed one each between one of the one or more control terminals and the RC filter, each comparator being connected to a reference voltage so that the output of a given comparator is high or low depending on whether the voltage at the RC filter is greater than or less than the reference voltage connected to the given comparator.

2. The control circuit of claim 1 further comprising a latch disposed between the one or more comparators and the one or more control terminals.

3. The control circuit according to claim 1 or claim 2 further comprising:

a delay selector disposed between the delay circuit and the second input of the exclusive OR gate, the delay selector allowing a user to change the number of delay elements in the single chain; and a delay compensation circuit disposed between the clock terminal and the first input of the exclusive OR gate.

4. A compensated CMOS driver circuit comprising:

first and second supply voltage terminals;

first and second data input terminals;

output terminal;

a clock terminal:

a pull-up transistor disposed between the first supply voltage terminal and the output terminal;

pull-down means connected to the second supply voltage terminal and to the second data input terminal so that the pull down means is turned on or off depending on a voltage at the second data input terminal, the pull-down means having one or more control inputs, voltages at the one or more control inputs determining an effective channel width of the pull-down means;

an N-well self-biasing circuit disposed between the first supply voltage terminal and the output terminal;

means for turning the pull-up transistor on and off in response to a voltage present at the first data input terminal; and a control circuit connected to the one or more control inputs for setting voltage levels at the one or more control inputs so that the effective channel width of the pull-down means is proportional to delay introduced in the driver circuit only by process and environmental variables, the control circuit further including:

an exclusive OR gate having first and second inputs and an output, the first input of the exclusive OR gate connected to the clock terminal;

a delay circuit disposed between the clock terminal and the second input of the exclusive OR gate, the delay circuit being formed only by a single chain of delay elements connected in series so that the delay is influenced only by the number of delay elements and process and environmental variables;

an RC filter connected to the output of the exclusive OR gate; and one or more comparators disposed one each between one of the one or more control inputs and the RC filter, each comparator being connected to a reference voltage so that the output of a given is comparator is high or low depending on whether the voltage at the RC filter is greater than or less than the reference voltage connected to the given comparator.

5. The CMOS driver circuit of claim 4 wherein the control circuit includes a latch disposed between the one or more control inputs and the one or more comparators for capturing and holding the voltage levels at the one or more control inputs.

6. The CMOS driver circuit according to claim 4 or claim 5 wherein the control circuit includes:

a delay selector disposed between the delay circuit and the second input of the exclusive OR gate, the delay selector allowing a user to change the number of delay elements in the single chain; and a delay compensation circuit disposed between the clock terminal and the first input of the exclusive OR gate.

7. A CMOS integrated circuit comprising:

a clock terminal:

logic for performing various computations;

an input/output controller connected to the logic, the input/output controller having a plurality of signal lines for connection to external devices, the input/output controller including a plurality of driver circuits for driving the plurality of signal lines, at least one driver circuit having a pull-down means with one or more control inputs; and a control circuit connected to the one or more control inputs for setting voltage levels at the one or more control inputs so that an effective channel width of the pull-down means is proportional to delay introduced in the driver circuit only by process and environmental variables the control circuit further including:

an exclusive OR gate having first and second inputs and an output, the first input of the exclusive OR gate connected to the clock terminal;

a delay circuit disposed between the clock terminal and the second input of the exclusive OR gate, the delay circuit being formed only by a single chain of delay elements connected in series so that the delay is influenced only by the number of delay elements and process and environmental variables:

an RC filter connected to the output of the exclusive OR gate: and one or more comparators disposed one each between one of the one or more control inputs and the RC filter, each comparator being connected to a reference voltage so that the output of a given is comparator is high or low depending on whether the voltage at the RC filter is greater than or less than the reference voltage connected to the given comparator.

8. The CMOS integrated circuit of claim 7 wherein the control circuit includes a latch disposed between the one or more control inputs and the one or more comparators for capturing and holding the voltage levels at the one or more control inputs.

9. The CMOS integrated circuit according to claim 7 or claim 8 wherein the control circuit includes:

a delay selector disposed between the delay circuit and the second input of the exclusive OR gate, the delay selector allowing a user to change the number of delay elements in the single chain; and a delay compensation circuit disposed between the clock terminal and the first input of the exclusive OR gate.

10. A control circuit for a compensated driver circuit, the control circuit comprising:

a clock terminal;

one or more control terminals for connection to one or more respective control inputs of said compensated driver circuit;

a phase detector having first and second inputs and an output, the first input of the phase detector connected to the clock terminal;

a delay circuit disposed between the clock terminal and the second input of the phase detector, the delay circuit being formed by a single chain of delay elements connected in series so that the delay is influenced only by the number of delay elements and process and environmental variables;

an integrator connected to the output of the phase detector; and a comparator bank disposed between the one or more control terminals and the integrator, the comparator being connected to one or more reference voltages.

11. The control circuit of claim 10 further comprising a register having one or more latches, the register disposed between the comparator bank and the one or more control terminals.

12. The control circuit according to claim 10 or claim 11 further comprising:

a delay selector disposed between the delay circuit and the second input of the phase detector, the delay selector allowing a user to change the number of delay elements in the single chain; and a delay compensation circuit disposed between the clock terminal and the first input of the phase detector.

* * * * *